United States Patent
Sundaresan et al.

(10) Patent No.: US 9,369,140 B1
(45) Date of Patent: Jun. 14, 2016

(54) ANALOG TO DIGITAL CONVERTER FOR DIGITAL ULTRASOUND PROBE

(71) Applicant: GENERAL ELECTRIC COMPANY, Schenectady, NY (US)

(72) Inventors: Krishnakumar Sundaresan, Clifton Park, NY (US); Naresh Kesavan Rao, Clifton Park, NY (US); Bruno Hans Haider, Ballston Lake, NY (US); Christopher Robert Hazard, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/635,155

(22) Filed: Mar. 2, 2015

(51) Int. Cl.
*H03M 1/12* (2006.01)
*H03M 1/00* (2006.01)
*H03M 1/10* (2006.01)
*H03M 1/44* (2006.01)

(52) U.S. Cl.
CPC ............ *H03M 1/002* (2013.01); *H03M 1/1033* (2013.01); *H03M 1/442* (2013.01)

(58) Field of Classification Search
CPC ... H03M 1/164; H03M 1/804; H03M 1/1215; H03M 1/468; G01S 7/5206; G01S 7/52038; G01S 7/52034; G01S 7/52085; G01S 7/52063; G01S 7/52066; G01S 15/8906; A61B 8/06; A61B 8/0833
USPC .......... 241/120–165; 600/440, 441, 445, 443, 600/447, 437
See application file for complete search history.

(56) References Cited

U.S. PATENT DOCUMENTS

| | | | | |
|---|---|---|---|---|
| 6,063,033 | A * | 5/2000 | Haider | G01S 7/52038 600/447 |
| 6,346,079 | B1 * | 2/2002 | Haider | G01S 7/52066 600/443 |
| 6,567,228 | B1 * | 5/2003 | Bhandari | G11B 5/09 360/46 |
| 6,879,277 | B1 | 4/2005 | Cai | |
| 7,397,409 | B2 | 7/2008 | Jeon et al. | |
| 7,977,979 | B2 * | 7/2011 | Cho | H03F 3/45475 327/63 |
| 7,978,117 | B2 * | 7/2011 | Jeon | H03M 1/164 341/155 |
| 7,999,719 | B2 * | 8/2011 | Jeon | H03M 1/164 341/118 |
| 8,531,328 | B2 | 9/2013 | Jeon et al. | |
| 2004/0125006 | A1 * | 7/2004 | Tani | H03M 1/1038 341/155 |
| 2010/0066583 | A1 * | 3/2010 | Jeon | H03M 1/164 341/161 |

(Continued)

FOREIGN PATENT DOCUMENTS

EP 1851859 B1 7/2009
EP 2629429 A1 8/2013

OTHER PUBLICATIONS

Lee et al., "A SAR-Assisted Two-Stage Pipeline ADC", Solid-State Circuits, IEEE Journal of, vol. 46, Issue 4, pp. 859-869, Apr. 2011.

(Continued)

*Primary Examiner* — Lam T Mai
(74) *Attorney, Agent, or Firm* — Eileen B. Gallagher (57) ABSTRACT

An ultrasound probe analog to digital converter includes an input successive approximation register (SAR) first stage; and an output SAR second stage in communication with the input SAR first stage. The input SAR first stage includes a programmable preamplifier integrated therein for residue amplification. The preamplifier is programmed to alternate between a linear amplifier operating mode and a comparator operating mode.

20 Claims, 8 Drawing Sheets

(56) References Cited

U.S. PATENT DOCUMENTS

| | | | |
|---|---|---|---|
| 2011/0304493 A1* | 12/2011 | Mitikiri | H03M 1/462 341/150 |
| 2012/0229313 A1 | 9/2012 | Sin et al. | |
| 2014/0184434 A1* | 7/2014 | Chen | H03M 1/145 341/155 |
| 2014/0207054 A1* | 7/2014 | Kabnick | A61B 18/04 604/26 |
| 2015/0008688 A1* | 1/2015 | Furuichi | H01L 21/67742 294/183 |
| 2015/0018688 A1* | 1/2015 | Osawa | G01S 15/8915 600/459 |

OTHER PUBLICATIONS

Cho, Chang-Hyuk, "A Power Optimized Pipelined Analog-to-Digital Converter Design in Deep Sub-Micron CMOS Technology", Georgia Institute of Technology, Dec. 2005, pp. 1-164.

* cited by examiner

ANALOG TO DIGITAL CONVERTER FOR DIGITAL ULTRASOUND PROBE

BACKGROUND

The subject matter of this disclosure relates generally to ultra-low power analog-to-digital conversion for portable applications, and more particularly, to ultra-low power analog to digital converters (ADCs) that enable maintaining power dissipation in a digital ultrasound probe and prevent temperature rise from exceeding 43° C.

Ultra-low power ADCs, that consume less than 5 mW while performing 12 bit conversions at 50 MSPS, are required for some applications such as a digital ultrasound probe. This is necessary to maintain the overall power dissipation in the probe and prevent temperature rise from exceeding 43° C., which is a regulatory cutoff limit. Most commercial ADCs operating at this speed and resolution typically consume 20 mW or higher, which is too high to integrate into a digital probe. An integrated solution wherein the analog to digital converter (ADC) directly drives the digital beam-former built in a single ASIC offers some power saving benefits in the interconnect. However, the core ADC will still consume a significant amount of power if implemented with standard analog to digital conversion techniques.

Conventional techniques include ramp and sigma-delta converters for low speed, high resolution converters, and pipelined converters for higher speed designs. Single stage Successive Approximation Register (SAR) converters are popular in the moderate range of ~10 bits. The advent of modern sub-90 nm CMOS processing has pushed the speed limits of such converters in to the tens of MHz range.

The advent of deep-sub micron CMOS processes enables low power digital calibration. However, the power required by analog components in the data converter does not scale. Hence, the advantage shifts to "analog light" converter design. Recent literature shows that pipelining a SAR converter to improve resolution and push to higher speed is gaining importance. Some of these approaches have limitations in the design implementation.

Time-interleaving multiple ADCs, for example, is an option if power consumption and larger area can be afforded. Sharing op-amps to reduce power is also a popular technique, but is limited to lower speeds. Another technique includes the use of dynamic comparators, but is limited in resolution. A class of ADCs known as predictive ADCs that take advantage of signal properties has also been investigated. While knowing the signal properties can help take advantage of this in an algorithmic converter and achieve significant power savings, the issue of prediction failure is not well addressed. It typically means building two ADCs, one full power that is active for a part of the time and a predictive converter operating most of the time. Other approaches include minimizing the number of system channels and reducing resolution or speed, all of which adversely affect image quality.

In view of the forgoing, it would be advantageous to provide an ultra-low power ADC architecture for portable applications such as a digital ultrasound probe. The ultra-low power ADC architecture should enable the digital ultrasound probe to maintain a desired power dissipation and prevent a temperature rise from exceeding 43° C.

BRIEF DESCRIPTION

According to one embodiment, an ultrasound probe analog to digital converter (ADC), comprise an input successive approximation register (SAR) first stage; and an output SAR second stage in pipelined communication with the input SAR first stage, wherein the input SAR first stage comprises a programmable preamplifier integrated therein for input SAR first stage residue amplification, and further wherein the preamplifier is programmed to alternate between a linear amplifier operating mode and a comparator operating mode.

According to another embodiment, the ultrasound probe ADC input SAR first stage comprises a capacitive digital to analog converter (DAC) programmed to perform energy efficient sampling and to generate a residue signal for canceling a residue error generated by the input SAR first stage.

According to another embodiment, the ultrasound probe ADC further comprises a calibration third stage in pipelined communication with the output SAR second stage, wherein the calibration third stage is programmed for calibrating output SAR second stage integral nonlinearity and output second stage differential nonlinearity.

According to still another embodiment, the ultrasound probe ADC input SAR first stage and the output SAR second stage each comprise a programmable capacitive digital to analog converter (DAC) with switching controls generated locally with scaled replicas of a corresponding comparator to enable timing signals associated with each DAC to mimic settling delays of the corresponding comparator.

According to still another embodiment, the ultrasound probe ADC is programmed to automatically deactivate the input SAR first stage based on a predetermined pulse frequency and ultrasound probe application.

According to still another embodiment, the common mode reference voltage for each channel in the ultrasound probe is generated locally within the channel to minimize channel-to-channel cross-talk According to still another embodiment, the common mode reference voltage generator is deactivated on a pre-determined pulse pattern specific to the ultrasound probe to improve energy efficiency of the ADC.

DRAWINGS

These and other features, aspects, and advantages of the present invention will become better understood when the following detailed description is read with reference to the accompanying drawings.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
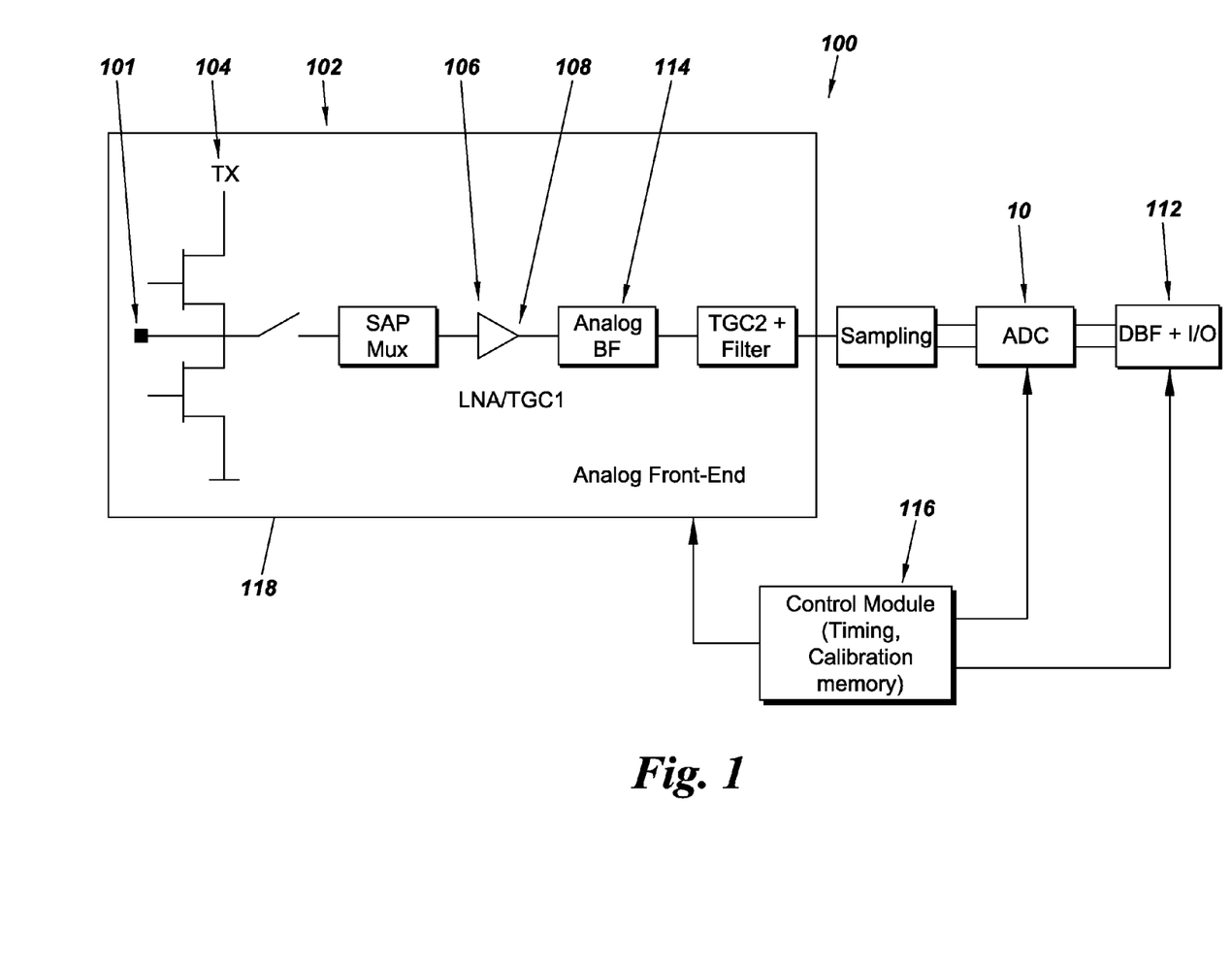
FIG. 1 is a simplified block diagram of an ultrasound digital probe, according to one embodiment.

FIG. 1 is a simplified diagram of an ultrasound digital (UD) probe 100, according to one embodiment. According to one aspect, the ultrasound digital probe 100 combines all ultrasound specific hardware in one probe to enable direct digital interface to a display device (not shown). The UD probe 100 comprises several channels 102 of HV transmitters 104, low noise and variable gain receive amplifiers 106, 108, ADCs 10 and a digital beam-former 112.

Ultrasound probes may be used to integrate devices from the transducer array 101 to the TGC1 108 and stage 1 analog beam former (BF) 114. The remainder of the system resides in a system PC and is connected with analog cables.

With continued reference to FIG. 1, an ultrasound digital probe may be implemented according to one embodiment using an ultra-low power analog to digital converter (ADC) 10 in combination with a digital beam-former (DBF) 112. Although beam-former power can be scaled by using modern CMOS processes (90 nm or below), no process choice presently exists for the ADC 10. Integrating the ADC 10 with the DBF 112 however does lower power consumption of the corresponding interconnect(s). The ADC 10 and DBF 112 most preferably cover a wide frequency range to enable a wide variety of applications from cardiac applications at low frequencies of ~2.5 MHz (ADC frequency of ~10 MHz) to abdominal/small parts that run up to 15 MHz (ADC frequency of 50 MHz). Thus, the ADC 10 should scale in power to provide a viable product for FIG. 5 desired applications. The ultra-low power ADC 10 according to one embodiment may be implemented by scaling all internal timing and delays with a master clock described herein with reference to FIG. 7. The master clock and all clock edges may be slowed for low frequency applications to allow for lower power dissipation for low frequency probes.

Figure 2:
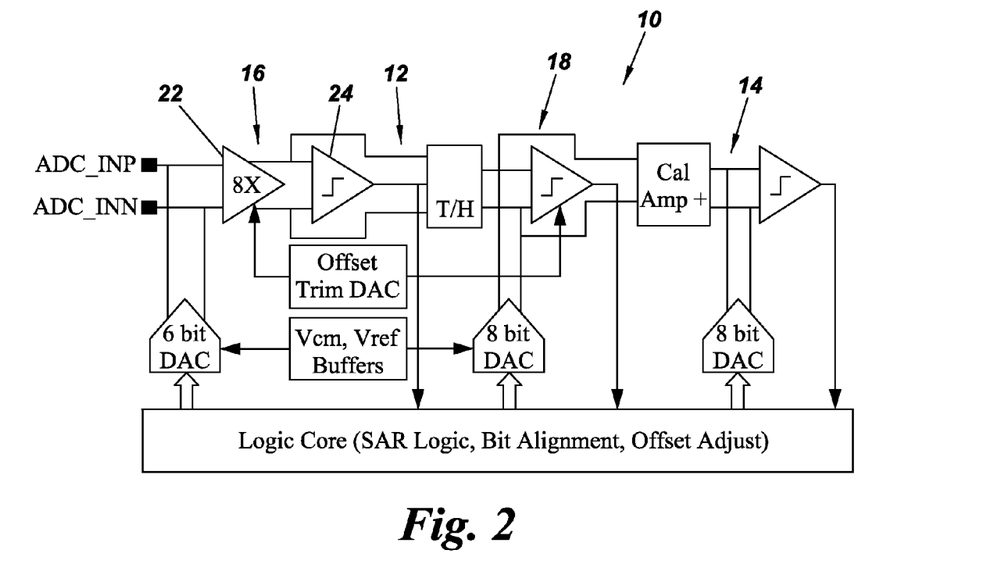
FIG. 2 is a system block diagram of a programmable ultrasound probe analog to digital converter (ADC), according to one embodiment.

The UD probe 100 further comprises a programmable control module 116 that provides timing controls to sequence the analog front-end (AFE) 118 including transmit, receive, gain control, and so forth. The AFE 118 further provides ADC timing controls based on the master clock thus power and data rate are controlled for multiple imaging modalities. According to one aspect, the control module 116 comprises memory for storing ADC 10 and AFE 118 calibration coefficients FIG. 2 is a system block diagram of a programmable ultrasound probe analog to digital converter (ADC) 10, according to one embodiment. The ultrasound probe ADC 10 comprises a two-stage successive approximation register (SAR) 12 and a third pipelined stage 14 for calibration. The two-stage SAR 12 comprises an input SAR first stage 16 and an output SAR second stage 18. The input SAR first stage 16 may comprise, for example, a 5-6 bit capacitive digital to analog converter (DAC), and the output SAR second stage 18 may comprise, for example, a 7-8 bit capacitive DAC for resolving 7-8 bits with some overlap to correct for non-idealities. The third pipelined stage 14 may comprise, for example, without limitation, a 7-8 bit DAC. The ultrasound probe ADC further comprises SAR logic, bit alignment and offset adjustment elements 1. A programmable preamplifier 22 is integrated with the input SAR first stage 16, and is programmed to operate in a linear amplifier mode or a comparator mode, as required during operation of the ultrasound probe ADC 10.

Most SAR ADC architectures either omit a preamplifier at the cost of lower resolution due to additional sensitivity to charge injection or use a separate preamplifier that is not sufficiently linear and an inter-stage amplifier with higher linearity for residue amplification. The ultrasound probe ADC 10 advantageously combines the preamplifier 22 and a comparator 24 into a single unit, saving both area and power. As such, this unique combination is possible as the preamplifier 22 is necessarily linear only for residue amplification, and that the residue is typically smaller than the full-input signal. The preamplifier 22 is required, for example, to be linear only for $\frac{1}{64}$V or 16 mV for a 6-bit first stage ADC with a 1V input. Feedback elements may be introduced to improve linearity even further for lower speed applications. Additional switches may be introduced in a feedback amplifier to ensure high speed operation in the convert phase and higher linearity in the residue generation phase.

Figure 3:
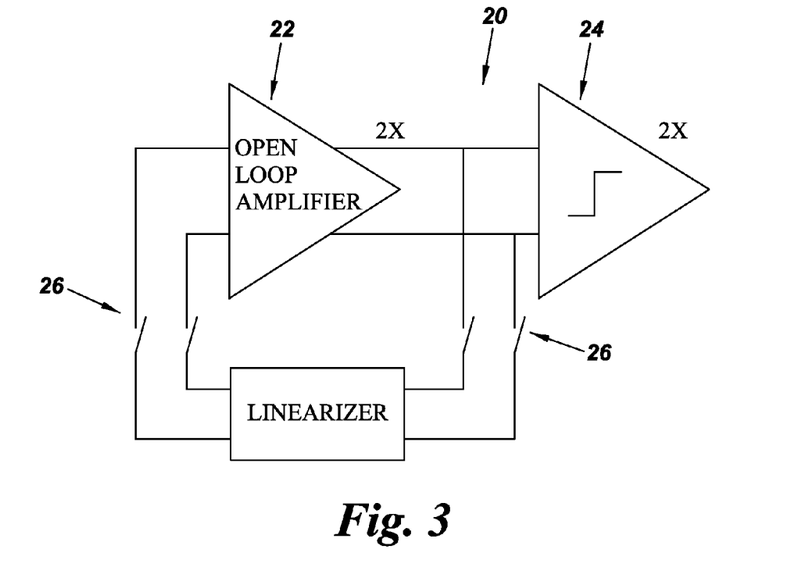
FIG. 3 is a simplified block diagram showing a preamp-comparator, according to one embodiment.

FIG. 3 is a simplified preamp-comparator block diagram 20, according to one embodiment. The preamplifier-comparator 20 comprises a two-cell unit including an open loop amplifier 22 and a comparator 24. According to one embodiment, the preamp-comparator 24 comprises programmable switches 26 allowing only a 1× amplifier unit to be used during lower speed applications.

Figure 4:
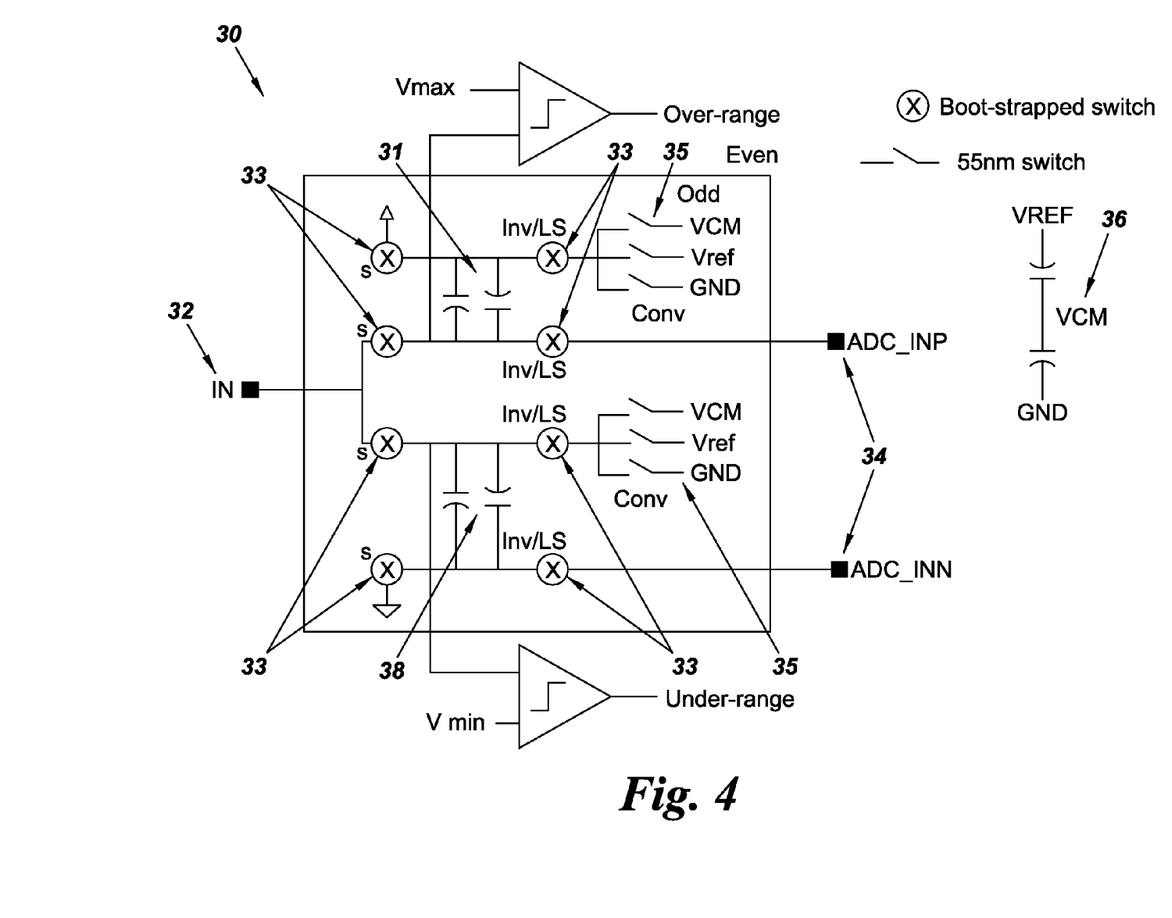
FIG. 4 is a schematic diagram illustrating an analog to digital converter (ADC) sampling scheme, according to one embodiment.

FIG. 4 is a schematic diagram illustrating an analog to digital converter (ADC) sampling scheme 30, according to one embodiment. A single-ended input signal 32 that is centered around 0V is converted to a differential signal 34 that is centered at a common mode voltage 36 using an invert/level-shift phase. This feature provides advantages for domestic digital ultrasound probe applications and is not available in generic SAR ADC structures. The embodied switching scheme advantageously eliminates the need for a fully differential amplifier that is typically employed to generate a fully differential signal, and saves a significant amount of power. As such, in certain embodiments, this allows for an amplifier-free process.

According to one embodiment, odd/even phases are used for conversion with two capacitor banks 31, 38 for the front end. This feature allows for higher speed of operation since one capacitor bank can be used for conversion while the second capacitor bank is sampling. Further, back-to-back capacitors are employed to mitigate non-linearity errors arising from asymmetric bottom plate effects.

According to another embodiment, the ADC front end employs a plurality of boot-strap switches 33. The boot-strap switches 33 are higher voltage (HV) switches used for the invert/level-shift phase, avoiding reliability and harmonic distortion issues generally associated with lower voltage (LV) switches.

According to yet another embodiment, only lower voltage switches 35 are used in the convert phase. This structure advantageously minimizes errors due to charge injection.

The LV switches 35 operate to decouple the common mode voltage (Vcm) 36 directly to the ADC reference voltage (Vref) and ADC ground (GND), minimizing charge errors arising from Vref/GND bounce. Such Vref/GND bounce is a problem generally associated with multi-channel systems since Vref/GND bounce from one channel couples to another and becomes an unwanted source of common mode error. This structure also advantageously eliminates the need for local Vref buffers, further lowering power consumption.

Figure 5:
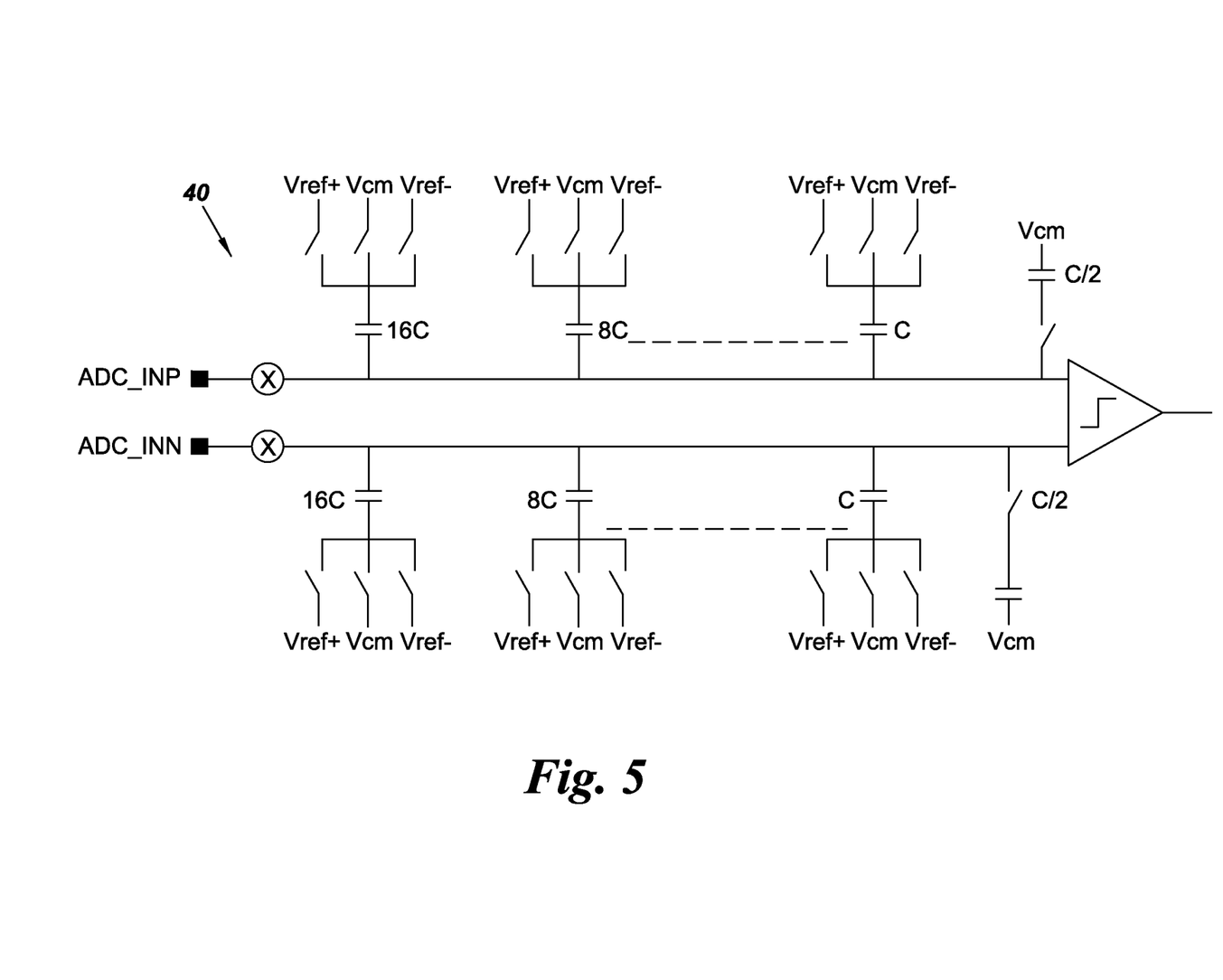
FIG. 5 is a schematic diagram illustrating a first stage digital to analog conversion (DAC) scheme associated with the most significant bit (MSB) of ADC switching with residue generation, according to one embodiment.

According to still another embodiment, over-ranging conditions are detected while using odd/even phasing. If the input signal after sampling is found to be greater than the ADC range, an over-range condition is declared and assigned a code of zero or max, based on whether the result is an under-shoot or overshoot. In certain embodiments the ADC range may be predetermined with an external reference voltage. This feature allows for protecting lower voltage devices and prevents converting an over-ranged sample, further conserving power. As such, the embodiment provides an integrated system providing over-range protection in operation FIG. 5 is a schematic diagram illustrating a first stage digital to analog conversion (DAC) scheme 40 associated with the most significant bit (MSB) of ADC switching with residue generation, according to one embodiment. The first stage DAC scheme 40 uses energy efficient sampling, resulting in significant area and power savings for the first stage DAC 16 shown in FIG. 2 without the penalty of additional reference voltage buffers or non-linearity due to split capacitors. This technique is known for use with a single stage converter. If the comparator output=1 at a particular decision step, then the next binary capacitor at the top moves from Vcm to GND to reduce the positive input and the capacitor array on the bottom is moved from Vcm to Vref to increase the negative input. By repeating this process, the differential input is slowly converged to zero while deciding at each stage whether each bit is a 0 or 1, depending on whether INP>INN, thus providing differential conversion of the input.

It should be noted that a residual error of +/−0.5 LSB is generated at the end of the MSB ADC conversion process when extending the foregoing technique to a pipelined ADC, such as ADC 10 shown in FIG. 2. ADC 10 however, resolves the residual error via an algorithm that uses a deterministic sign of the residual error as well as a deterministic magnitude of the residual error. The residual error is then canceled by introducing a dummy capacitor in the residue generation phase, wherein a capacitor with equivalent charge is added to Vinp or Vinn.

The residue generation phase employs a capacitance of C/2 connected to Vcm to correct for the residue error in the analog domain. This passes along the correct residue to the succeeding stage 18 such as shown in FIG. 2, while still maintaining the full dynamic range of the ADC second stage 18. It may be noted that using digital correction techniques to account for the residue typically results in reduced dynamic range for the ADC second stage 18.

Figure 6:
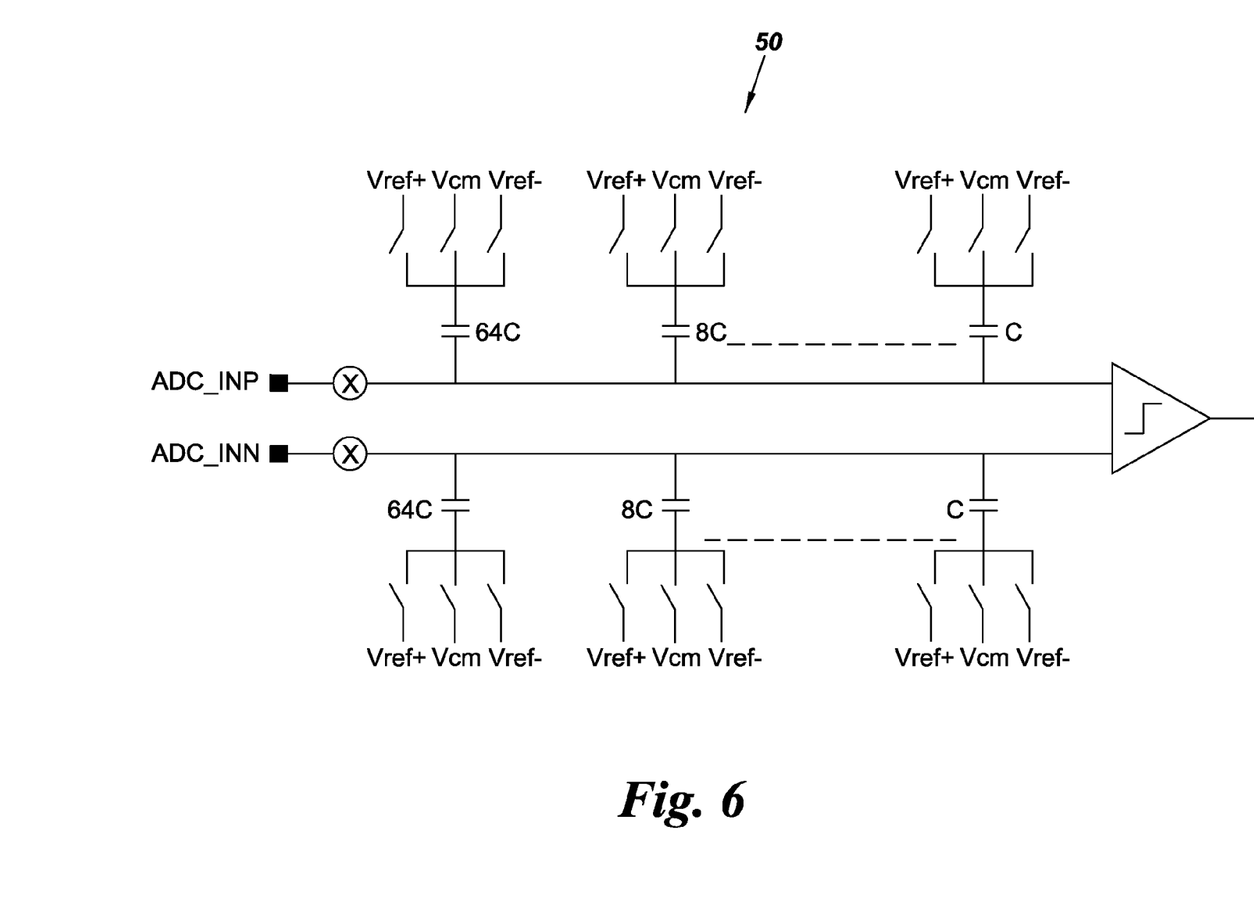
FIG. 6 is a second stage DAC scheme associated with the least significant bit (LSB) of ADC switching with residue generation, according to one embodiment.

FIG. 6 is a schematic diagram illustrating a second stage digital to analog conversion (DAC) scheme 50 associated with the least significant bit (LSB) of ADC switching with residue generation, according to one embodiment. The second stage DAC 50 employs an switching scheme similar to the merged capacitor described herein, but with a minor modification. The sampling is performed over two sets of capacitors and the conversion phase, one of the capacitors is inverted to provide an additional gain of 2. This improves signal to noise ratio with minimal added power, while alleviating linearity requirements on the pre-amplifier.

Figure 7:
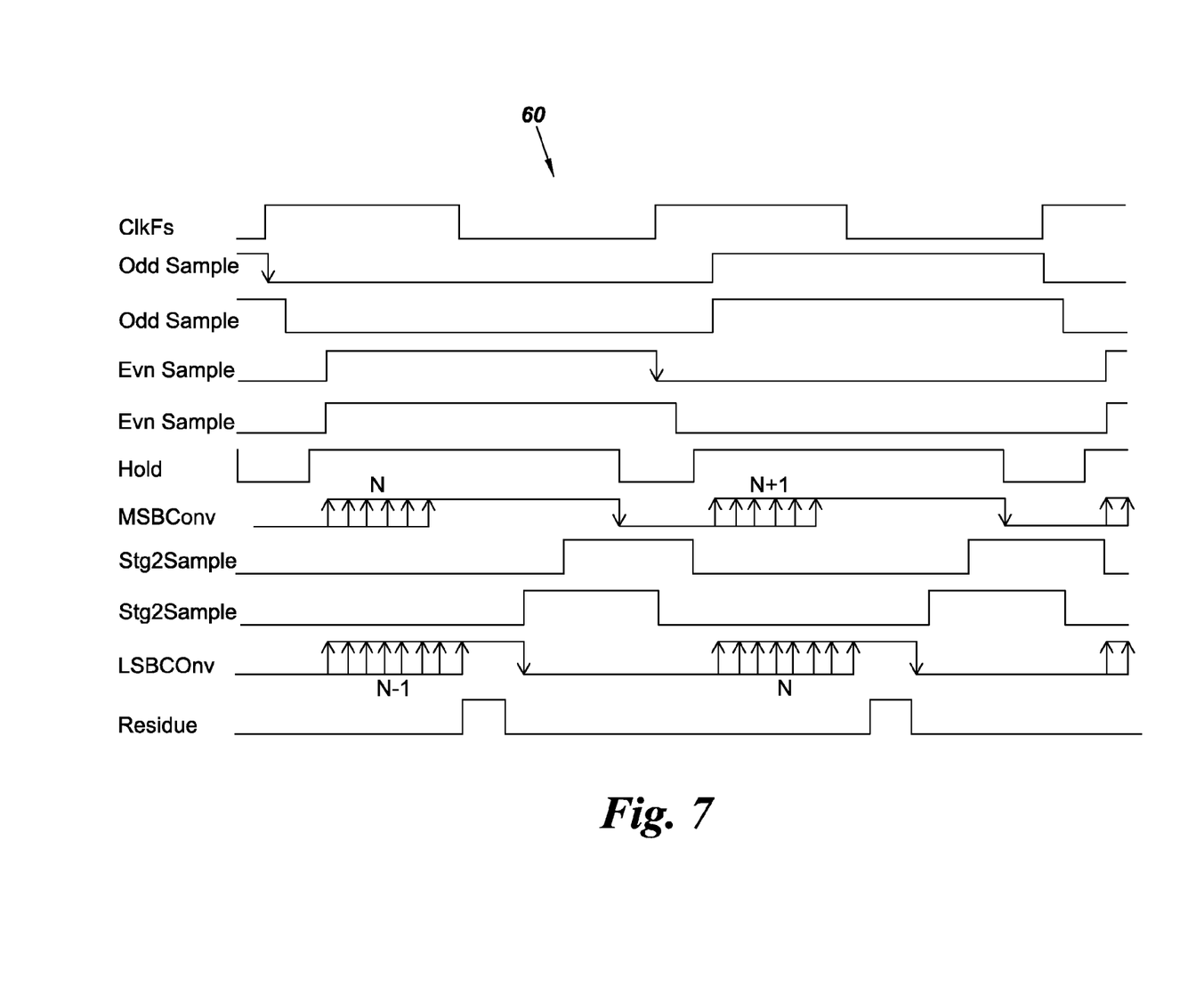
FIG. 7 is a high level timing diagram illustrating ADC timing, according to one embodiment.

FIG. 7 is a high level timing diagram 60 illustrating ADC timing, according to one embodiment. Since the ADC 10 requires several comparisons in a single sample window, it can be appreciated that signals may necessarily be generated with delay errors in the sub-ns range. This is especially challenging in multichannel systems such as ultrasound and other medical imaging applications, where it is essential to maintain a uniform clock delay distribution over a wide area and control clock skew variation. According to one aspect, the switching controls during a DAC convert phase may be generated asynchronously by each comparator to account for this requirement.

The timing diagram 60 illustrates a typical timing from completion of odd sampling to MSB conversion of the Nth sample (odd sample). At the end of the sample, prior to conversion, the conversion is skipped if over-ranged. The LSB ADC is converting the N$-1^{st}$ sample when the MSB is converting the Nth phase. At the end of the Nth MSB convert, a correct residue is generated for the LSB ADC.

Further, according to one aspect, timing is arranged to allow for a quiet phase towards the end of all sampling phases. The convert phases are then synchronized to start simultaneously so that Vcm and Vref are not disturbed by converting while sampling a different sample.

According to another aspect, all clocking is asynchronous during the convert phase. Timing is generated by the comparator delay itself. A meta-stability override is used when a comparator becomes metastable or if a decision time exceeds a preset value. This preset timing may be generated, for example, by a replica delay cell of the comparator and shift register.

Ultrasound signals fade with time. Thus, the signal for a 12-bit converter working for 200 usec, a typical ultrasound receiver time, may fade to less than 8-bits by 100-150 usec depending on the frequency of the pulse and application. The ADC in such circumstances, according to one embodiment, can be converted to a single stage ADC for the very far-field by deactivating the first stage 16, resulting in significant power benefits. This feature is achieved according to one embodiment by repurposing the residue generation phase.

The structure described herein further lends itself to a generic type of predictive conversion. Predictive converters can offer significant power savings over traditional converters for deterministic signals such as ultrasound, since a guess is made regarding several MSBs based on known signal properties. The issue of prediction failure however, is one that is not well-addressed, since a prediction failure typically leads to a full-conversion that requires additional area and power. A multi-stage SAR may offer the best overall trade-off regarding implementing a predictive converter. A guess can be pre-populated by introducing a predictive DAC sampling phase in the timing. Within two clock cycles of the converter, a value can be successfully predicted, and the residue information can be used in the event of a prediction failure for switching to a conventional binary search. The foregoing technique requires no area overhead. The power overhead of prediction is less than 20% and a successful prediction can yield power savings greater than 75%.

According to another aspect, power consumption may be controlled for low frequencies using bias control and by using, for example, only a 1× comparator. Further, the use of over-range detection saves power when very large signals are received. Another power saving mechanism is implemented using a single stage for far-field conversion, as stated herein, since the power to the first stage may be duty cycled under such conditions.

One issue with use of multiple stage SAR ADCs for high resolution converters, relates to nonlinearity errors introduced by mismatches in the capacitor array, in the threshold voltage of the comparator for example. These issues may cause imaging artifacts since they distort the digital code in a deterministic fashion. Such errors are typically addressed by calibration. The errors from the first stage in a two-stage SAR typically dominate the error budget and require calibration. The second stage is designed to be within specification. The tradeoffs to be made in order to guarantee calibration-free operation of the second stage for multi-channel ADCs and ones with sub-LSB linearity requirements entail the use of large capacitors. By definition, sub-LSB errors cannot be measured. This increases power and area and decreases speed. In contradistinction, one embodiment of a calibration structure and method of calibration is described herein with reference to FIG. 2, where an additional calibration stage ADC is used to measure the INL/DNL errors in the second stage of the converter and store calibration coefficients for the same. This ensures that the burden of ensuring sub-LSB INL/DNL can be handled without additional probe hardware which is critical in a digital ultrasound probe.

Figure 8:
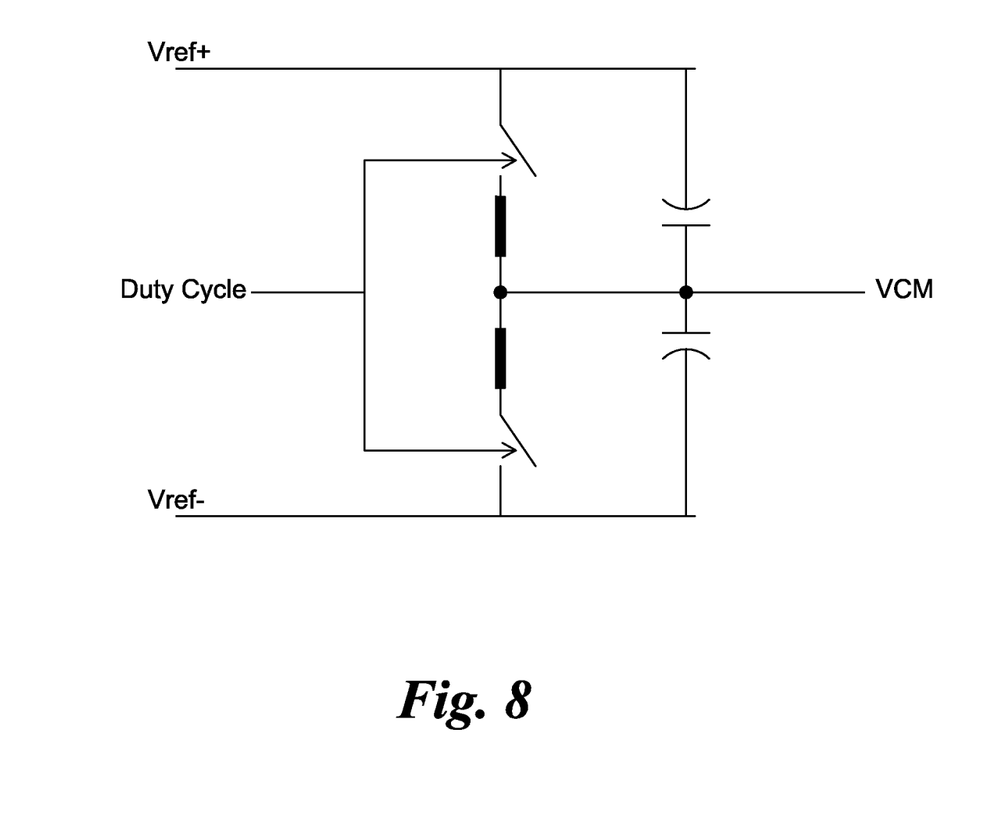
FIG. 8 is a schematic diagram illustrating the generation of a common-mode voltage for the specific channel ADC.

FIG. 8 shows a schematic diagram of a local Vcm generator. One of the challenges in designing multi-channel high speed ADCs is the cross-talk between channels that can result from the common supplies and references that supply the DAC capacitors. To minimize this cross-talk, the common mode voltage reference may be generated locally within each channel. To ensure energy efficient common mode voltage generation, this circuit may be periodically turned off based on specific probe operating frequencies to ensure minimal power overhead from the circuit.

Figure 9:
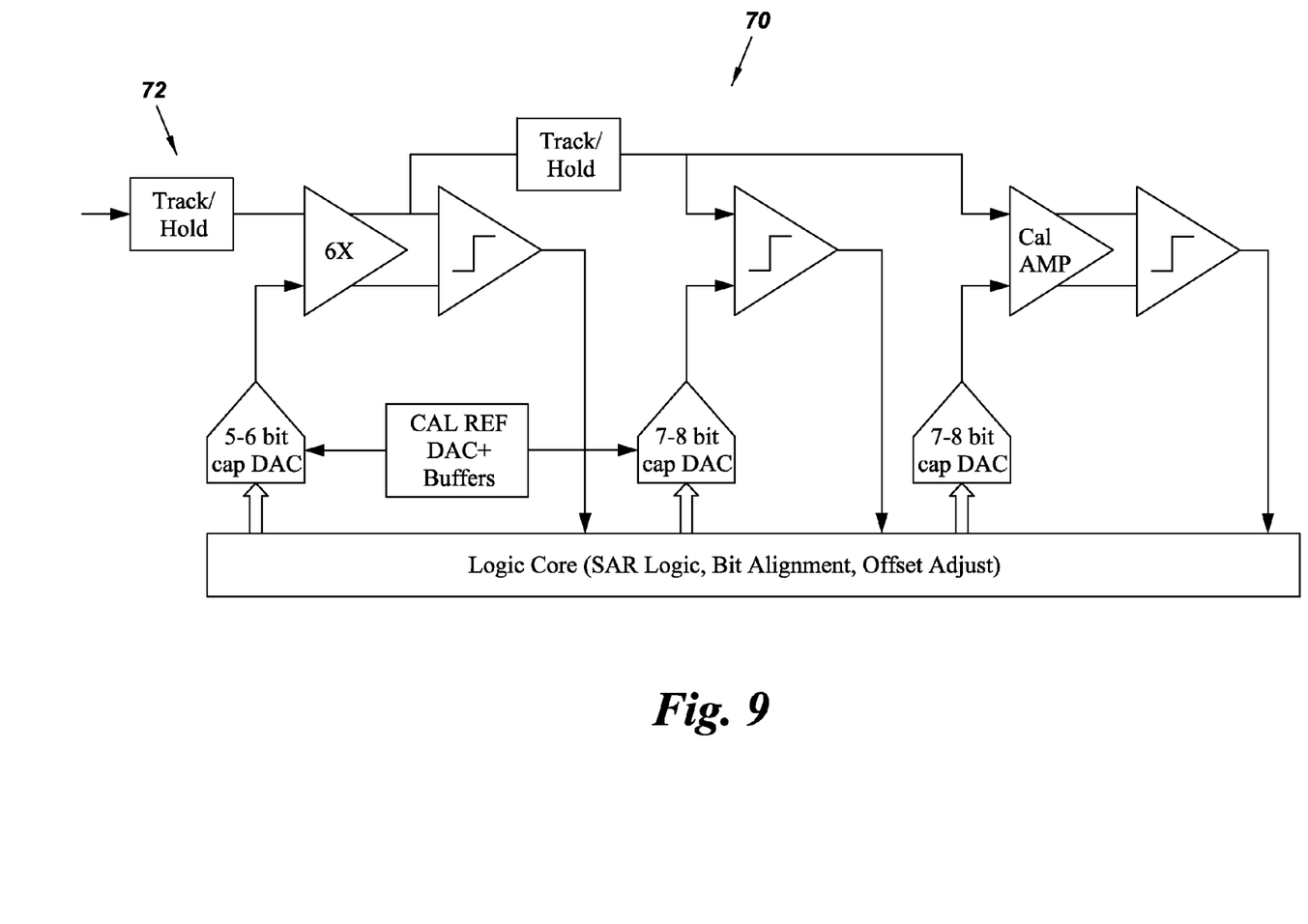
FIG. 9 is a system block diagram illustrating yet another embodiment of the ADC, comprising active track and hold circuitry.

FIG. 9 is another system block diagram of a programmable ultrasound probe ADC 70, according to one embodiment. The ADC 70 illustrates more clearly the placement of the first stage sample and hold front end 72. Although particular embodiments have been described herein with reference to a particular number of MSBs and LSBs, other embodiments directed to different numbers of MSBs and LSBs can also be constructed using the principles described herein.

The logic core block as shown in FIG. 9 serves as a digital filter which combines the comparator outputs from the successive comparator stages, apply correction terms, and form the final digital output representation. As such, in certain embodiments this may be referred to as a digital processing logic core. Operations include synchronizing the outputs from the different stages to a specific clock edge, appropriately weighting the different comparator outputs, and correcting for the static errors from the preamplifier and the DAC by applying pre-determined calibration coefficients for the gain and offset. In certain embodiments if also includes converting the outputs to a predetermined digital representation such as, such as but not limited to 2 s complement or offset binary representations, and presenting the output to the digital beamformer at the specified time.

While the invention has been described in terms of various specific embodiments, those skilled in the art will recognize that the invention can be practiced with modification within the spirit and scope of the claims.

The invention claimed is:

1. An ultrasound probe analog to digital converter (ADC), comprising:
   a two-stage successive approximation register (SAR) type converter comprising a preamplifier integrated between two SAR stages for first stage residue amplification;
   a SAR capacitor array with amplifier free sampling;
   a digital processing logic core configured to weigh and combine the outputs of the two stages; and where
   the preamplifier is;
     programmed to alternate between a linear amplifier operating mode and a comparator operating mode; and
     further comprises multiple unit cells and stages, and configured to allow some of the units to be deactivated for predetermined low speed applications.

2. The ultrasound probe ADC according to claim 1 wherein the SAR capacitor array is configured to convert a single-ended input signal into a differential signal.

3. The ultrasound probe ADC according to claim 2 wherein the differential signal is generated based on a predetermined ADC operating range and configured to provide over-range protection.

4. The ultrasound probe ADC according to claim 3 wherein the ADC range is determined by a reference voltage.

5. The ultrasound probe ADC according to claim 1, wherein the first stage further comprises a capacitive digital to analog converter (DAC) programmed to perform energy efficient sampling and to generate a residue signal for canceling a residue error generated by the first stage.

6. The ultrasound probe ADC according to claim 5, wherein the SAR capacitor array is so arranged to provide a signal gain during conversion, improving linearity of the programmable preamplifier.

7. The ultrasound probe ADC according to claim 6, wherein the sampling path capacitor is a programmable capacitor.

8. The ultrasound probe ADC according to claim 1, further comprising a calibration third stage in pipelined communication with the output SAR second stage.

9. The ultrasound probe ADC according to claim 8, wherein the calibration third stage is programmed for calibrating output SAR second stage nonlinearity.

10. The ultrasound probe ADC according to claim 1, wherein the input SAR first stage comprises a programmable capacitive digital to analog converter (DAC) with switching controls generated locally with scaled replicas of a corresponding comparator configured to enable time signals associated with the DAC to mimic settling delays of the corresponding comparator.

11. The ultrasound probe ADC according to claim 1, wherein the output SAR second stage comprises a programmable capacitive digital to analog converter (DAC) with switching controls generated locally with scaled replicas of a corresponding comparator configured to enable timing signals associated with the DAC to mimic settling delays of the corresponding comparator.

12. The ultrasound probe ADC according to claim 1, wherein the input SAR first stage is programmed to be deactivated based on a predetermined pulse frequency and ultrasound probe application.

13. The ultrasound probe ADC according to claim 1, wherein the input SAR first stage comprises a sample and hold front end, wherein the sample and hold front end comprises an invert/level-shift switching structure for converting a single-ended input signal centered around 0V to a differential signal centered at a predetermined common mode voltage.

14. The ultrasound probe ADC according to claim 13, wherein the sample and hold front end comprises a first capacitor bank for signal sampling and a second capacitor bank for signal conversion during the first capacitor bank sampling.

15. The ultrasound probe ADC according to claim 13, wherein the invert/level-shift switching structure comprises a plurality of high voltage bootstrap switches configured to enable rail-to-rail operation.

16. The ultrasound probe ADC according to claim 13, wherein the sample and hold front end comprises a plurality of low voltage switches in electrical communication with the plurality of high voltage bootstrap switches, the plurality of low voltage switches for switching during a signal convert phase.

17. The ultra sound probe ADC according to claim 13, wherein the sample and hold front end comprises a plurality of back-to-back capacitors for mitigating non-linearity errors arising from asymmetric bottom capacitor plate effects.

18. The ultrasound probe ADC according to claim 13, wherein the sample and hold front end comprises input signal sampling over-range circuitry for protecting corresponding low voltage switches and preventing converting of over-ranged signal samples.

19. The ultrasound probe ADC according to claim 13, wherein a common mode voltage for the ADC stages is directly derived in each channel from the supply voltages.

20. The ultrasound probe ADC according to claim 19, wherein the sample and hold front end comprises a common mode voltage decoupled directly to two reference voltages.

* * * * *